(12) United States Patent
Kristensen

(10) Patent No.: US 9,570,224 B2
(45) Date of Patent: Feb. 14, 2017

(54) PRESSURE COMPENSATION SYSTEM

(71) Applicant: Knut Schonhowd Kristensen, Trondheim (NO)

(72) Inventor: Knut Schonhowd Kristensen, Trondheim (NO)

(73) Assignee: Siemens Aktiengesellschaft, München (DE)

(*) Notice: Subject to any disclaimer, the term of this patent is extended or adjusted under 35 U.S.C. 154(b) by 0 days.

(21) Appl. No.: 14/662,467

(22) Filed: Mar. 19, 2015

(65) Prior Publication Data

US 2015/0277452 A1 Oct. 1, 2015

(30) Foreign Application Priority Data

Mar. 28, 2014 (EP) .................................... 14162433

(51) Int. Cl.
*H01F 27/14* (2006.01)
*H05K 5/06* (2006.01)
(Continued)

(52) U.S. Cl.
CPC ............. *H01F 27/14* (2013.01); *E21B 33/035* (2013.01); *E21B 33/0385* (2013.01);
(Continued)

(58) Field of Classification Search
CPC .... H01F 27/14; H05K 5/068; F15B 2201/205; F15B 2201/3153; F15B 2201/515; F15B 2201/50; F15B 2201/505; E21B 33/0385; E21B 33/035; Y10T 137/2036; Y10T 137/0379; G05D 16/2093; F16L 55/04; F16L 55/053; F16L 55/05
(Continued)

(56) References Cited

U.S. PATENT DOCUMENTS 3,163,985 A * 1/1965 Bouyoucos ............... F15B 1/02
137/81.2
3,330,902 A * 7/1967 Nakazawa .............. H01F 27/14
138/30
(Continued)

FOREIGN PATENT DOCUMENTS

DE 10207598 A1 * 11/2002 ............ B60T 8/4081
DE 10137988 A1 * 2/2003 .............. F15B 1/103
(Continued)

OTHER PUBLICATIONS

European Search Report cited in EP 14 162 433.8, mailed Jul. 29, 2014.

*Primary Examiner* — Kevin Murphy
*Assistant Examiner* — David Colon Morales
(74) *Attorney, Agent, or Firm* — Lempia Summerfield Katz LLC

(57) ABSTRACT

A pressure compensation system is provided. A subsea enclosure of the subsea device encloses the chamber. A first pressure compensator has a first compensation volume and provides pressure balancing between ambient medium surrounding the subsea device and the first compensation volume. A first biasing device is configured to bias the first pressure compensator such that the pressure in the first compensation volume is higher than the pressure in the ambient medium surrounding the subsea device. A second pressure compensator has a second compensation volume and provides pressure balancing between the ambient medium and the second compensation volume. A second biasing device biases the second pressure compensator such that the pressure in the second compensation volume is higher than the pressure in the ambient medium. A control unit is connected to control first and second valves arranged (Continued)

in flow connections between the first and second compensation volumes and the chamber.

17 Claims, 5 Drawing Sheets

(51) Int. Cl.
   *E21B 33/038* (2006.01)
   *E21B 33/035* (2006.01)
   *G05D 16/20* (2006.01)
(52) U.S. Cl.
   CPC ......... *G05D 16/2093* (2013.01); H05K 5/068 (2013.01); *F15B 2201/205* (2013.01); *F15B 2201/3153* (2013.01); *F15B 2201/515* (2013.01); *Y10T 137/0379* (2015.04); *Y10T 137/2036* (2015.04)
(58) Field of Classification Search
   USPC .................................. 138/30, 31, 26; 60/413
   See application file for complete search history.

(56) References Cited

U.S. PATENT DOCUMENTS

| | | | | |
|---|---|---|---|---|
| 3,695,297 A * | 10/1972 | Ferrentino | ............. | H02G 15/26 138/30 |
| 4,095,421 A * | 6/1978 | Silcox | ................. | E21B 33/0355 137/236.1 |
| 4,167,201 A * | 9/1979 | Zahid | ........................ | F15B 1/08 138/30 |
| 4,243,856 A * | 1/1981 | Gratzmuller | .............. | F15B 1/08 200/81 R |
| 4,487,226 A * | 12/1984 | Chun | ........................ | F15B 1/08 138/30 |
| 5,221,125 A * | 6/1993 | Okochi | ................. | B60T 8/3615 188/151 A |
| 5,357,999 A * | 10/1994 | Loth | .................... | E21B 33/0355 137/236.1 |
| 6,488,487 B2 * | 12/2002 | Minato | ............... | F04B 11/0016 138/30 |
| 6,494,545 B2 * | 12/2002 | Nakamura | ............ | B60T 8/4081 138/30 |
| 6,612,818 B2 * | 9/2003 | Nishio | .................... | F04B 43/08 138/30 |
| 6,766,681 B2 * | 7/2004 | Suzuki | .................... | B60T 13/14 303/87 |
| 6,845,793 B2 * | 1/2005 | Ruffer | .................... | F15B 1/033 138/30 |
| 6,983,592 B2 * | 1/2006 | Bruun | .................... | F15B 1/08 60/415 |
| 8,051,872 B2 * | 11/2011 | Lenz | .................... | E21B 33/0355 137/236.1 |
| 8,146,417 B2 * | 4/2012 | Glasson | .................... | F15B 1/08 73/168 |
| 8,365,651 B2 * | 2/2013 | Dorr | ......................... | F15B 1/08 92/5 R |
| 8,596,608 B2 * | 12/2013 | Grimseth | ............ | E21B 33/0355 137/12 |
| 2003/0075225 A1 * | 4/2003 | Dinkel | .................... | F15B 1/103 138/31 |
| 2003/0136123 A1 * | 7/2003 | Seguin | ...................... | F15B 1/10 60/413 |
| 2004/0051615 A1 * | 3/2004 | Hafskjold | ........... | E21B 33/0385 336/57 |
| 2004/0090113 A1 * | 5/2004 | Pahl | ......................... | F15B 1/08 303/113.4 |
| 2008/0302115 A1 * | 12/2008 | Eknes | .................... | H05K 5/068 62/183 |
| 2008/0308168 A1 * | 12/2008 | O'Brien, II | ............... | B60K 6/12 138/31 |
| 2010/0206399 A1 * | 8/2010 | Kerr | .................... | B63C 11/2245 137/395 |
| 2011/0046901 A1 * | 2/2011 | Boissonneau | ........... | F15B 1/022 702/50 |
| 2011/0226369 A1 * | 9/2011 | Uusipaikka | ......... | E21B 33/0385 138/30 |
| 2012/0291688 A1 * | 11/2012 | Dawes | .................... | B63C 11/00 114/312 |
| 2013/0000290 A1 * | 1/2013 | Zhang | ..................... | F15B 21/14 60/327 |
| 2013/0167962 A1 * | 7/2013 | Skjetne | .................. | F16L 55/04 138/30 |
| 2013/0199168 A1 * | 8/2013 | Ankargren | .............. | B66C 13/02 60/327 |
| 2013/0262010 A1 * | 10/2013 | Reuter | ................... | G01B 21/16 702/94 |
| 2013/0284532 A1 * | 10/2013 | McVey | .................... | B62D 5/30 180/403 |
| 2014/0060030 A1 * | 3/2014 | Ma | .......................... | E02F 9/123 60/413 |

FOREIGN PATENT DOCUMENTS

| | | | | | |
|---|---|---|---|---|---|
| DE | EP 2660422 A1 | * | 11/2013 | ......... | E21B 33/0355 |
| EP | 2169690 A1 | | 3/2010 | | |
| EP | 2571034 A1 | | 3/2013 | | |
| EP | 2610881 A1 | | 7/2013 | | |
| EP | 2698610 A1 | | 2/2014 | | |
| EP | 2698611 A1 | | 2/2014 | | |
| FI | WO 2010034880 A1 | * | 4/2010 | ......... | E21B 33/0385 |
| GB | 1023452 A | * | 3/1966 | ............ | H01F 27/14 |
| GB | 2028003 A | * | 2/1980 | ............ | H01F 27/14 |
| NO | WO 2007055588 A1 | * | 5/2007 | ............ | H01F 27/14 |
| WO | WO2007055588 A1 | | 5/2007 | | |
| WO | WO2010034880 A1 | | 4/2010 | | |
| WO | WO2011088840 A1 | | 7/2011 | | |

* cited by examiner

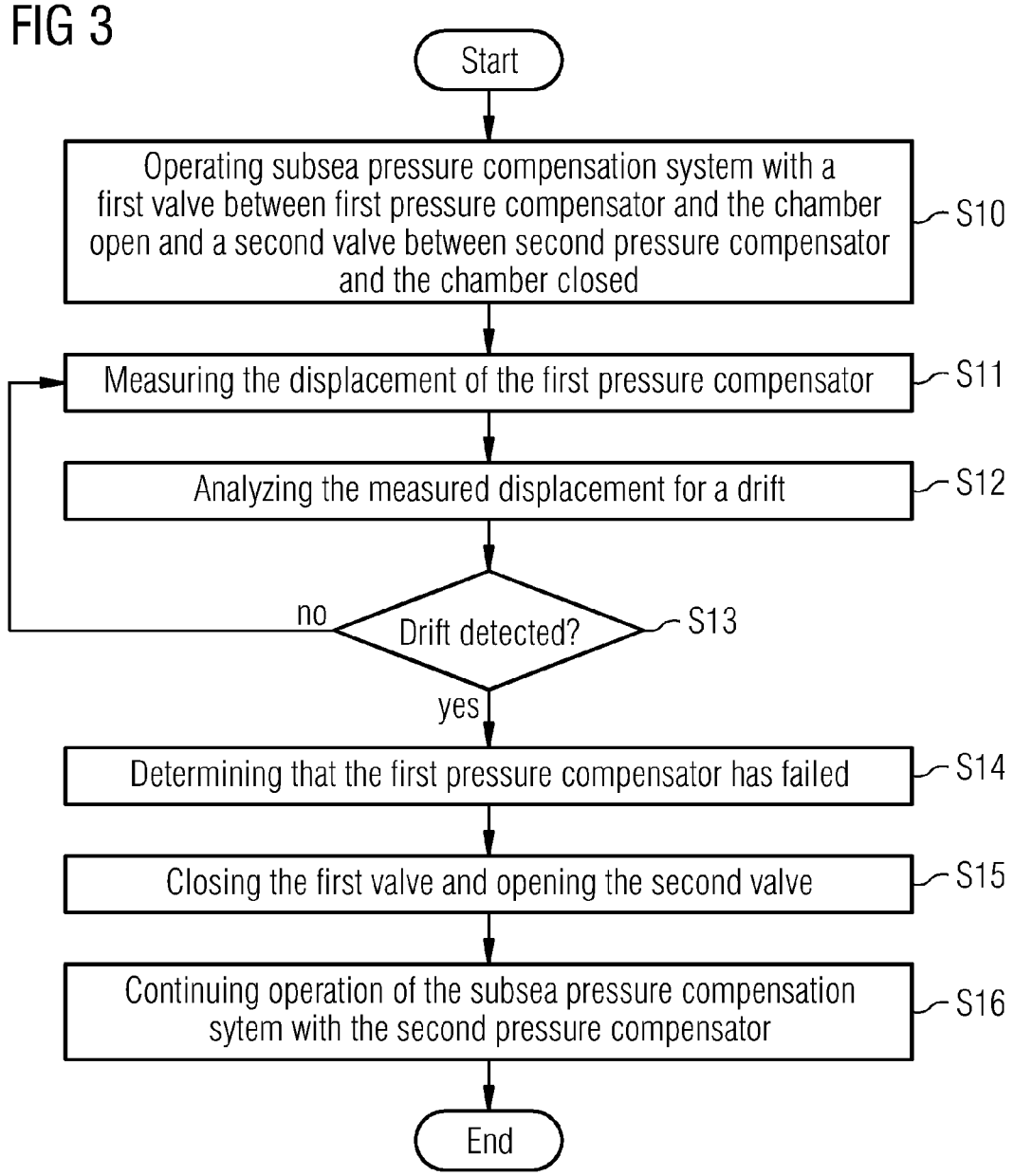

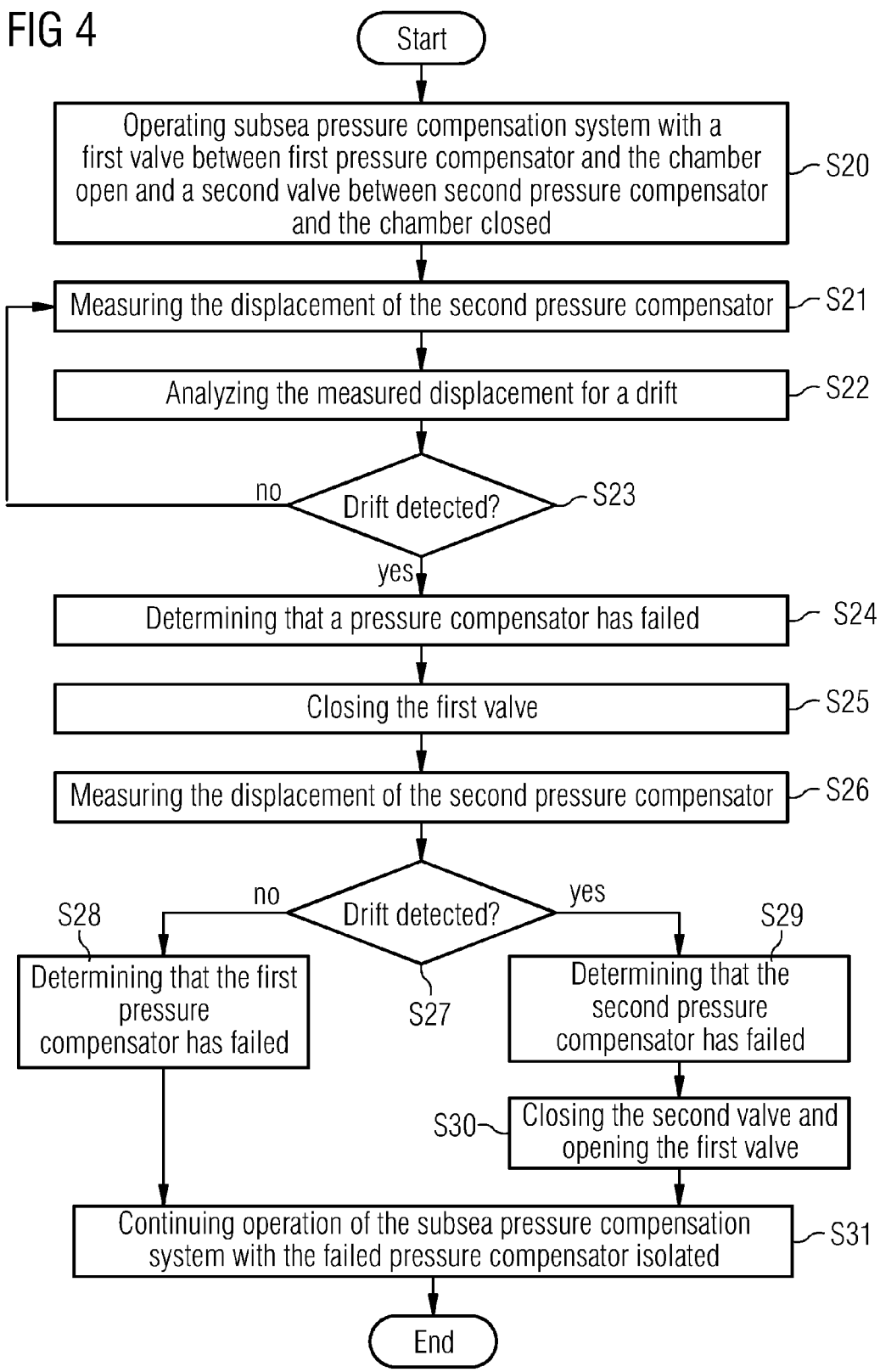

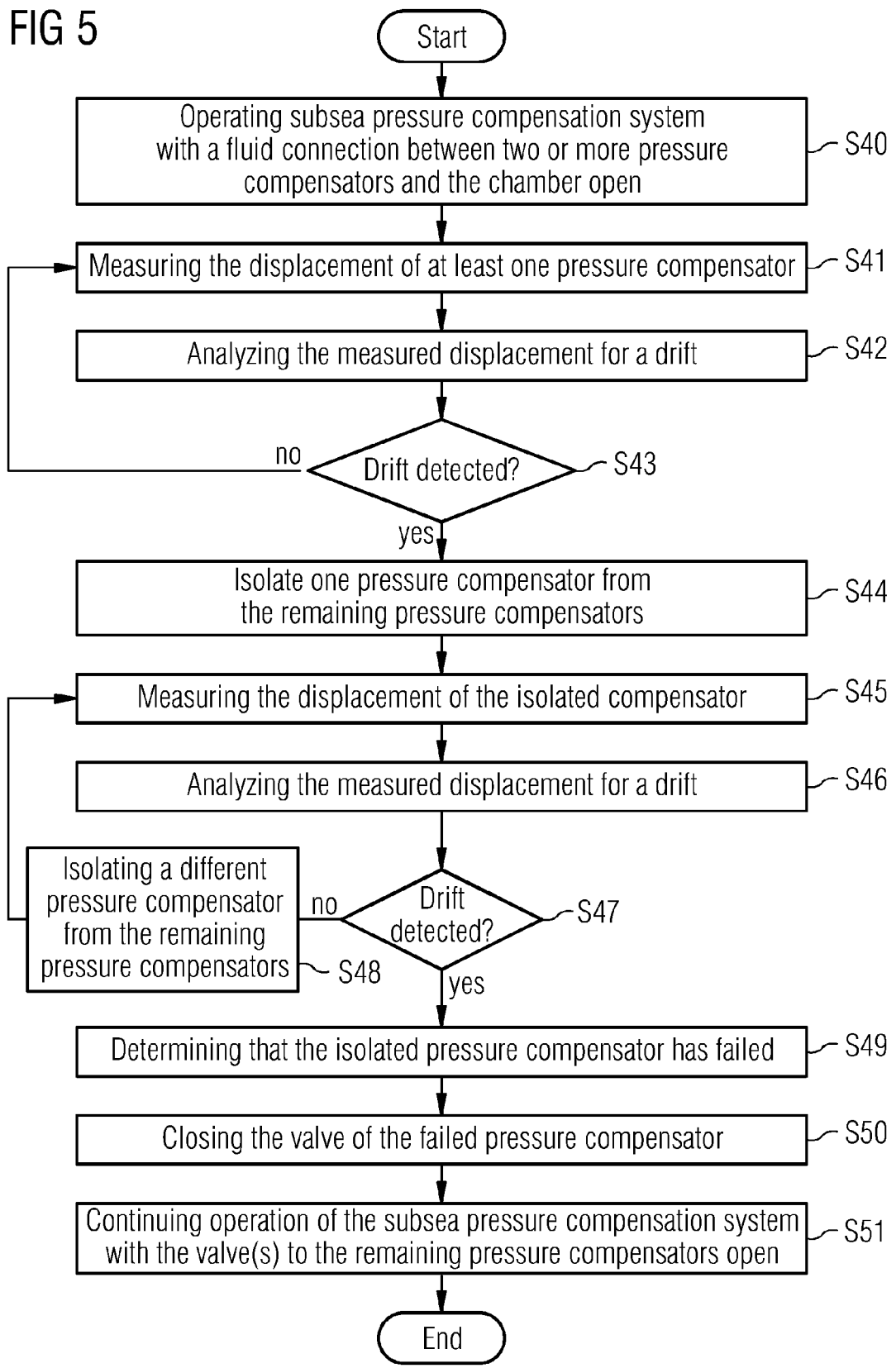

PRESSURE COMPENSATION SYSTEM

CROSS-REFERENCE TO RELATED APPLICATIONS

This application claims the benefit of EP 14162433.8, filed on Mar. 28, 2014, which is hereby incorporated by reference in its entirety.

TECHNICAL FIELD

The present embodiments relate to a pressure compensation system for compensating volume variations of a liquid in a chamber of a subsea device and to a method of operating a pressure compensation system.

BACKGROUND

Due to the increasing energy demand, offshore oil and gas production is moving into deeper waters. For providing an efficient and secure production of hydrocarbons from a subsea well, processing facilities are being installed at the ocean floor. Such subsea installations may include a range of components, including pumps, compressors, and the like as well as a power grid for providing such components with electric power. The power grid may, for example, include a subsea transformer, subsea switchgear, and subsea variable speed drives (VSDs). Such components of a subsea installation may be installed at water depths of 3,000 meters or more, so that they are exposed to pressures up to or even in excess of 300 bars. To protect such components from the corrosive seawater and to handle the high pressures prevailing in such subsea environment, these components are provided with subsea enclosures.

The construction of such subsea enclosures is technically challenging. Two solutions are proposed for dealing with these high pressures. A pressure resistant enclosure may be provided, which has a close to atmospheric internal pressure, enabling the use of conventional electric and electronic components. Such enclosures need to have relatively thick walls and are thus bulky and heavy, since they have to withstand high differential pressures.

Another solution is the use of pressurized (or pressure compensated) enclosures, which include a volume/pressure compensator that balances the pressure in the enclosure to the pressure prevailing in the ambient seawater. The pressure compensated enclosure may be filled with a liquid, and components operated inside the pressure compensated enclosure are made to be operable under high pressures. The pressure/volume compensator compensates variations in the volume of the liquid filling the enclosure, which may occur due to variations in ambient pressure and/or in temperature. Temperature changes may be caused by deployment at the subsea location and by internal heating, e.g., due to electric losses.

Pressure compensators may include metal bellows, rubber bellows, pistons, or the like. As an example, the document WO 2010/034880 A1 discloses a pressure compensator that has a first bellows chamber surrounded by a second bellows chamber, the second bellows chamber forming a closed intermediate space around the first bellows chamber. A double barrier against the ingress of seawater is thus obtained.

Furthermore, the document WO 2011/088840 A1 discloses a pressure compensation system that achieves a double barrier against the ingress of seawater.

Such type of double barrier may increase the safety and reliability of the pressure compensator only insignificantly. A failure of the pressure compensator may be caused by fatigue of the material of the bellows part, e.g., by the formation of cracks and thus leaks in the bellows part of the pressure compensator. As an example, through such crevice in the outer bellows portion, seawater may leak into the intermediate chamber, where it is stopped by the inner bellows part. Even so, both bellows parts undergo the same compression/decompression cycles, and are accordingly experiencing the same stress and fatigue. Both bellows portions are thus likely to fail within a relatively short period of time. Accordingly, the lifetime and thus the safety and reliability of such double barrier pressure compensator are not extended significantly by the second barrier.

U.S. Patent Publication No. 2013/0167962 A1 discloses a configuration that makes use of a particular arrangement of two bellows, thus increasing the compensation volume and keeping the dead volume small. A single barrier configuration having an improved reliability may thus be achieved.

Nevertheless, it is desirable to further increase the reliability of a pressure compensator for a subsea device. It is desirable to both improve the protection against ingress of seawater, and furthermore increase the lifetime over which such pressure compensator may be operated.

SUMMARY AND DESCRIPTION

The scope of the present invention is defined solely by the appended claims and is not affected to any degree by the statements within this summary. The present embodiments may obviate one or more of the drawbacks or limitations in the related art.

There is a need for providing improved pressure compensation for a subsea device. In particular, there is a need to achieve pressure compensation with improved reliability.

One embodiment provides a pressure compensation system for compensating volume variations of a liquid in a chamber of a subsea device. The pressure compensation system includes a subsea enclosure of the subsea device that encloses the chamber. The pressure compensation system further includes a first pressure compensator that has a first compensation volume, where the first pressure compensator is configured to provide a pressure balancing between ambient medium surrounding the subsea device and the first compensation volume, wherein a flow connection is provided between the first compensation volume and the chamber. The pressure compensation system further includes a first biasing device configured to bias the first pressure compensator such that pressure in the first compensation volume is higher than the pressure in the ambient medium surrounding the subsea device. In such configuration, a small overpressure compared to the pressure of the ambient medium may be provided in the first compensation volume and thus in the chamber.

A second pressure compensator is further provided having a second compensation volume, where the second pressure compensator is configured to provide a pressure balancing between the ambient medium surrounding the subsea device and the second compensation volume. A flow connection is provided between the second compensation volume and the chamber. A second biasing device is configured to bias the second pressure compensator such that the pressure in the second compensation volume is higher than the pressure in the ambient medium surrounding the subsea device. The pressure compensation system further includes a controllable first valve arranged in the flow connection between the first compensation volume and the chamber, the first valve being operable to stop fluid flow between the first compensation volume and the chamber. The pressure compensation system further includes a controllable second valve arranged in the flow connection between the second compensation volume and the chamber, the second valve being operable to stop fluid flow between the second compensation volume and the chamber. A control unit is connected to the first and second valves and configured to automatically shut the first valve or the second valve upon detecting a failure of the first pressure compensator or the second pressure compensator, respectively.

By biasing the pressure compensators, the ingress of seawater into the compensation volume may be prevented, since a liquid filling the compensation volume will leak out. Furthermore, the detection of a failure of a pressure compensator, (e.g., a crack or crevice formed in the pressure compensator due to cyclic stress), may be facilitated. By the control unit and the controllable valves, it becomes possible to isolate a pressure compensator by closing the respective flow connection and to continue operation with a functioning pressure compensator. In particular, the control unit may be configured so as to maintain the first or the second pressure compensator in a standby mode in which the flow connection of the pressure compensator to the chamber is closed. The isolated pressure compensator may thus not experience the cyclic stresses that act on the other pressure compensator in operation. The lifetime of the pressure compensation system may thus be effectively doubled, since each pressure compensator may be operated over its full lifetime. This is in contrast to, e.g., double bellows compensators, in which both bellows experience the same cyclic stresses, thus resulting in an increased likelihood of failure of both bellows within a short period of time.

In other configurations, the control unit may be configured to operate the pressure compensation system with the first and second pressure compensators in parallel, thus reducing the utilization of each pressure compensator, which significantly increases the expected lifetime. Further pressure compensators may of course be provided, (e.g., a third, a fourth, a firth or even more pressure compensators), which may be operated correspondingly, whereby reliability and lifetime may be further increased. The first and second pressure compensators and the further pressure compensators, if provided, may be considered to form a group of pressure compensators.

The pressure compensators may only be single walled. They may thus be relatively compact, resulting in a relatively compact pressure compensation system. Furthermore, the flow connections of the first and second pressure compensators may be connected to different parts of the subsea enclosure of the subsea device, thus allowing a separation of the chamber into different compartments. The protection against ingress of seawater and the reliability may thus be improved further.

In an embodiment, the chamber of the subsea enclosure of the subsea device may include at least a first and a second compartment, wherein the flow connections of the first and second pressure compensators may lead into the first and second compartments, respectively. The compartments may be configured such that a flow connection for the liquid filling the chamber is provided between the compartments, the flow connection being such that the compartments may be isolated from each other, e.g., by closing a valve. A further safeguard against the ingress of seawater into the chamber may thus be achieved; in particular, one part of the chamber may be protected from seawater when the other part of the chamber is experiencing seawater ingress.

In an embodiment, the control unit may be configured to have a mode of operation in which the first valve and the second valve are open so as to provide pressure compensation of the chamber simultaneously by the first and second pressure compensators. This may improve the expected lifetime of each pressure compensator since the utilization of each pressure compensator may remain relatively low.

In an embodiment, the control unit may be configured to have a mode of operation in which the first valve is open and the second valve is closed so as to provide pressure compensation of the chamber by the first pressure compensator and to maintain the second pressure compensator in standby. In standby, the second pressure compensator does not compensate volume variations of the liquid in the chamber. The second pressure compensator will thus not be exposed to cyclic stresses, so that when the first pressure compensator fails, a new pressure compensator is "in reserve" and may become operational. The overall lifetime of the pressure compensation system may thus be increased significantly.

The control unit may be configured to automatically open the second valve upon detecting a failure of the first pressure compensator. Accordingly, by the control unit, the first pressure compensator may be automatically isolated and the second pressure compensator may automatically be put into operation.

The first pressure compensator and/or the second pressure compensator may be a bellows-type pressure compensator. The first and/or the second compensator may include first and second end walls and a bellows part disposed between the first and the second end walls. In other embodiments, the first pressure compensator and/or the second pressure compensator may be a membrane compensator, a bladder compensator or a piston compensator.

The first and second pressure compensators may be single barrier pressure compensators having a single bellows wall separating the compensation volume from ambient medium, in particular, from surrounding seawater when the pressure compensation system is installed subsea.

According to an embodiment, the pressure compensation system further includes a first measuring unit configured to measure the displacement of the first pressure compensator and/or a second measuring unit configured to measure the displacement of the second pressure compensator. As an example, measuring the displacement may include measuring the movement of an end wall of a bellows compensator, measuring the movement/deformation of a membrane of a membrane compensator, measuring the movement of a piston in a piston compensator or measuring the movement/deformation of a bladder of a bladder compensator. The control unit may be configured to determine the presence of a failure of the first or second pressure compensators on the basis of the displacement measured with at least one of the first or second measuring units. The first and second measuring units may, for example, include an inductive or an optical sensor to measure the displacement of the respective pressure compensator.

The control unit may be configured to detect drift in the measured displacement and to determine the presence of a failure upon detecting such drift. Drift may, for example, be detected when the average displacement of the pressure compensator changes continuously in one direction, in particular, when the displacement indicates a continuous decrease of the compensation volume. The pressure compensation system may be configured such that at least the displacement of the pressure compensator that is initially active, e.g., the valve of which is initially opened, is measured (active pressure compensator).

In an embodiment, the control unit may be configured to determine the location of a failure at the first or the second pressure compensator by detecting a drift in the displacement of the first or the second pressure compensator when the first compensation volume and the second compensation volume are not in fluid communication. This may, for example, be achieved by closing the first valve, closing the second valve, closing both valves, or closing a flow connection between two compartments of the chamber, if such are provided. If further pressure compensators are provided, the flow connection between these further pressure compensators and the chamber may be closed in order to determine the location of the failure. In a configuration in which each pressure compensator is provided with a measuring unit for measuring displacement, the pressure compensators may be isolated one after the other to detect displacement and drift for identifying the location of the failed pressure compensator.

The flow connection between the first and/or second compensation volume and the chamber may, for example, be provided by a duct or a pipe, and the respective valve may be disposed in such duct or pipe. The flow connection, in particular, the duct or pipe, may enter the pressure compensator through an end wall or a side wall.

The pressure compensation system may furthermore include a subsea canister disposed adjacent to the subsea enclosure of the subsea device. The control unit may be arranged in the subsea canister. The control unit may be a controller, in particular, control circuitry. As an example, a controller card (PCB) may be provided. In another embodiment, the control unit may, for example, be part of a protective relay, such as a SIPROTEC relay. The subsea canister may, for example, be a pressure resistant subsea canister having a predefined internal pressure of, e.g., below 5 bar or about 1.5 bar, which allows the operation of conventional electric and electronic components therein. The valves of the pressure compensation system may thus be controlled directly at the subsea installation in a reliable way.

The first and the second pressure compensators may each be sized such that each pressure compensator alone is capable of compensating the volume variations of the liquid in the chamber. If further pressure compensators are provided, these may be configured correspondingly.

In particular, the pressure compensation system may further include at least one, two, three, or more further pressure compensators, respective biasing devices, and respective controllable valves. These components may be configured as described above. The reliability and the lifetime of the pressure compensation system may thus be increased further, since, e.g., after failure of two pressure compensators, a third pressure compensator may be put from a standby mode into an active mode, thus keeping the subsea device operable.

The first and the second pressure compensators may be biased by a spring force or by a gravitational force. The first and the second pressure compensators may be biased by a weight mounted to a movable upper end plate of the respective compensator or by a spring applying a force to a movable end plate of the compensator. A spring force may also be applied by a bellows portion of a compensator when the respective compensation volume is filled with a liquid such that the bellows portion is stretched. The biasing of the first and second pressure compensators may be similar, yet in some configurations, a different biasing may be provided, for example, when the first and second pressure compensators are not operated in parallel.

The first and second valves may each be hydraulically operable or electrically operable. In an embodiment, the first and/or the second valve may be a magnetically actuated valve configured to open and close in response to an electric control signal. Such control signal may be provided by the control unit.

In a further embodiment, the pressure compensation system may be configured such that the first and second valves are arranged in the respective compensation volume, or are arranged in the chamber of the subsea device. In such configuration, the protection against ingress of seawater may be further improved, since the valves are protected from the corrosive high pressure seawater environment.

A further embodiment provides a subsea device, such as a subsea transformer, a subsea switchgear, or a subsea variable speed drive, which includes a pressure compensation system in any of the above outlined configurations.

An embodiment provides a method of operating a pressure compensation system in any of the above outlined configurations including the acts of operating the pressure compensation system in a normal mode of operation with at least the first valve in an open position, detecting a failure of the first pressure compensator, and automatically closing the first valve. By such method, the pressure compensation system may be protected efficiently against ingress of seawater, thus increasing the reliability of the pressure compensation system.

According to an embodiment, a method of detecting a failure in a pressure compensation system is provided. A group of pressure compensators, including, for example, the above outlined first and second pressure compensators, is provided for compensating volume changes of a liquid in a chamber of a subsea device. The group of pressure compensators includes at least a first pressure compensator and one or more further pressure compensators. The method includes biasing the pressure compensators in the group such that the pressure inside the pressure compensators is larger than a pressure prevailing in a medium surrounding the subsea device. The method further includes operating the pressure compensation system in a state or bringing the pressure compensation system into a state in which a flow connection between the first pressure compensator and the one or more further pressure compensators is closed. The method further includes measuring the displacement of at least one pressure compensator in the group. The method further includes determining the location of a failed pressure compensator based on the measured displacement by determining whether the first pressure compensator has failed or whether one of the further pressure compensators has failed based on the detection of drift in the measured displacement.

By making use of such method, it may be detected in a fast and efficient way in a system having plural pressure compensators which of the pressure compensators that has actually failed. By such method, this may be achieved even if only the displacement of a single pressure compensator is measured. The displacement of each pressure compensator may be measured. As an example, if the displacement of the first pressure compensator is measured and shows drift, it is determined that the first pressure compensator has failed, in particular, that it has a leak through which liquid filling the pressure compensator may leak out due to the biasing. By introducing the biasing of the pressure compensator, it is further achieved that drift may be used for detecting pressure compensator failure. If in the example, the displacement of the first pressure compensator does not show drift, it may be determined that one of the further pressure compensators has failed, e.g., that the second pressure compensator has failed if the system includes two pressure compensators.

In an embodiment, the method may further include the act of determining the presence of a failure by detecting drift in displacement of at least one pressure compensator or said group. When plural pressure compensators are active, this may be performed as an additional act before closing the flow connection. When only one pressure compensator is active, this may be performed simultaneously with the determination of the location of the failed pressure compensator, if the first pressure compensator shows drift, it may be determined that a fault occurred and that the location of the fault is the first pressure compensator based on the same displacement measurement.

In an embodiment, after closing the flow connection between the first pressure compensator and the further pressure compensators, when the displacement of the first pressure compensator is measured, it may be determined that the first pressure compensator has failed if the measure displacement shows drift, and it may be determined that one of the further pressure compensators has failed if the measured displacement does not show drift. In the latter case, it is possible to continue the method by taking another pressure compensator of the group as the first pressure compensator and repeating the method. This way, it may be determined efficiently which pressure compensator has failed.

In an embodiment, the displacement of each pressure compensator in the group may be detected. Detection of the location of the failed pressure compensator may thus be accelerated.

A flow connection may be provided between each pressure compensator and the chamber of the subsea device, and a controllable valve may be disposed in each flow connection.

Operating the pressure compensation system in a state or bringing the pressure compensating system into a state in which the flow connection between the first pressure compensator and the one or more further pressure compensators is closed may include providing a flow connection between one pressure compensator of the group of pressure compensators and the chamber in an open state to enable flow communication between the pressure compensator and the chamber and providing flow connections between the other pressure compensators of the group and the chamber in a closed state. Thus, it may be provided that during the failure detection, one pressure compensator remains active for compensating volume variation of the liquid in the chamber.

After detecting the failed pressure compensator, the method may further include the act of closing a flow connection between the failed pressure compensator and the chamber. Ingress of seawater into the chamber may thus be prevented.

The act of determining the location of the failed pressure compensator may be performed by a control unit, in particular, by a control unit configured as described herein.

The system may be operated or brought into the state in which the flow connection between the first pressure compensator and the one or more further pressure compensators is closed by closing a controllable valve between the first pressure compensator and the chamber, or closing a controllable valve between the one or more further pressure compensators and the chamber.

In some embodiments, the further pressure compensators may include at least a second and a third pressure compensator. If it is determined that one of the further pressure compensators has failed, the method may further include bringing the pressure compensation into a state in which a flow connection between the second pressure compensator and the third pressure compensator is closed, detecting the displacement of at least the second or the third pressure compensator and, based on the detected displacement, determining whether the second or the third pressure compensator has failed. Accordingly, also with more than two pressure compensators, it may be detected fast and efficiently which of the pressure compensators that has failed. More than three pressure compensators may be provided, and that the method may be applied correspondingly.

According to an embodiment, a pressure compensator system for compensating volume changes of a liquid in a chamber of a subsea device is provided. The pressure compensation system includes a group of pressure compensators including at least a first pressure compensator and one or more further pressure compensators. Flow connections are provided between pressure compensator and the chamber. Controllable valves are disposed in the flow connections. For each pressure compensator, a biasing device configured to bias the pressure compensator is provided, the biasing being such that the pressure inside the pressure compensator, in particular, in the compensation volume, is larger than a pressure prevailing in a medium surrounding the subsea device. A measuring unit is configured to measure the displacement of at least one pressure compensator in the group, and a control unit is provided for controlling the valves. The pressure compensation system is configured to perform any of the above outlined methods. The control unit may, in particular, be configured to control the operation of the pressure compensation system and to perform the determination of the location of the failed pressure compensator and to detect drift in the measured displacement.

It is to be understood that the features mentioned above and those yet to be explained below may be used not only in the respective combinations indicated, but also in other combinations or in isolation. In particular, any of the method acts described above may be performed by embodiments of the described pressure compensation system, and the pressure compensation system may be configured and configured to perform such method acts. Furthermore, embodiments of the method may include any acts described with respect to the pressure compensation system, and may make use of the described pressure compensation system in any disclosed embodiment or configuration.

BRIEF DESCRIPTION OF THE DRAWINGS

The foregoing and other features and advantages will become further apparent from the following detailed description read in conjunction with the accompanying drawings. In the drawings, like reference numerals refer to like elements.

FIG. 3 is a flow diagram illustrating a method according to an embodiment.

FIG. 4 is a flow diagram illustrating a method according to an embodiment.

FIG. 5 is a flow diagram illustrating a method according to a further embodiment.

DETAILED DESCRIPTION

Figure 1:
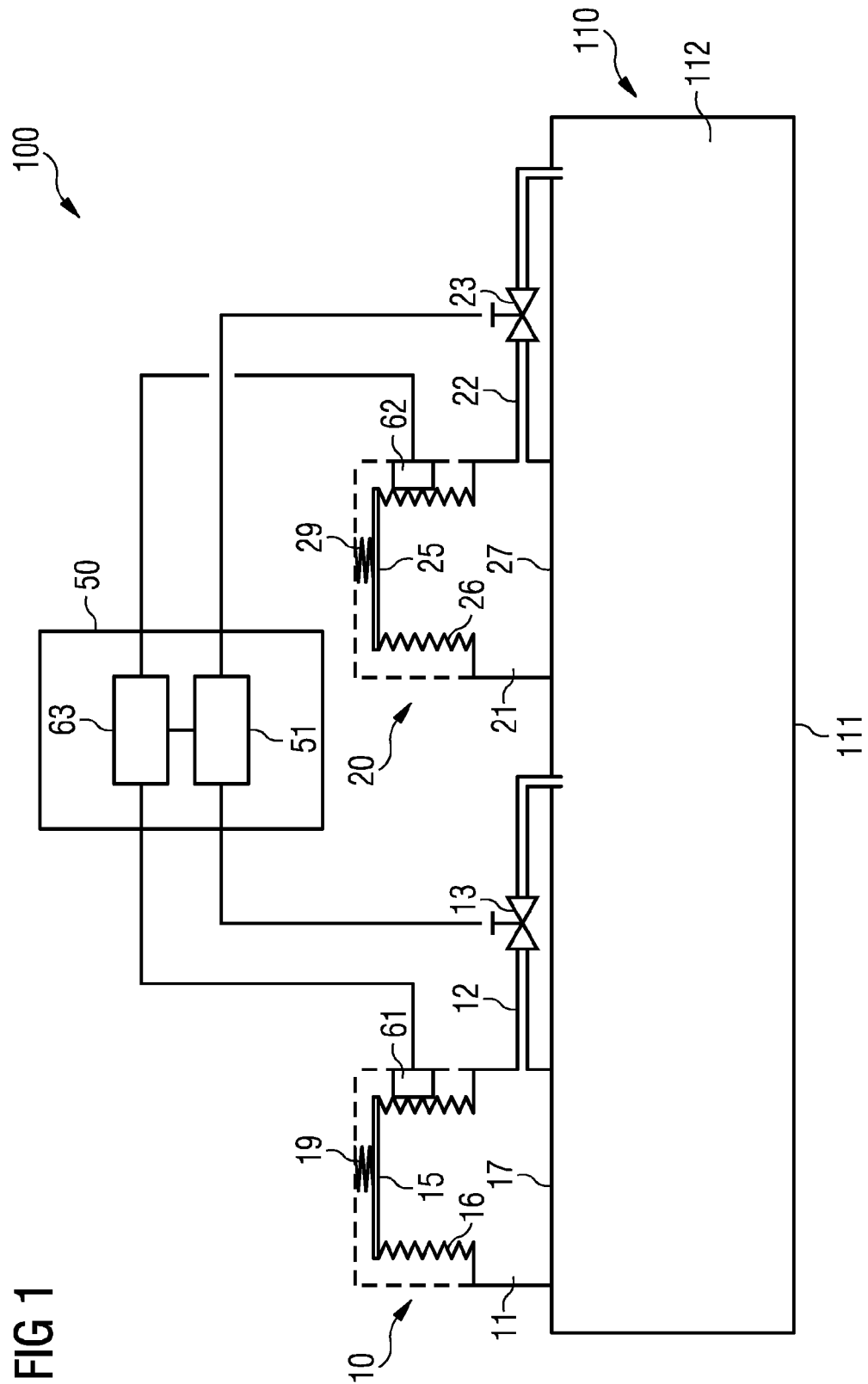
FIG. 1 is a schematic drawing depicting a pressure compensation system according to an embodiment.

In the following, the embodiments illustrated in the accompanying drawings are described in more detail. The following description is only illustrative and non-restrictive. The drawings are only schematic representations, and elements in the drawings are not necessarily to scale with each other.

FIG. 1 depicts a subsea device 110 having a subsea enclosure 111 that forms a chamber 112. The chamber 112 is filled with a liquid, in particular, a dielectric liquid, such as transformer oil, silicon oil, or the like. A pressure compensation system 100 is provided for compensating volume variations of the liquid filling chamber 112. As an example, the temperature of the liquid may change when the subsea device 110 is installed at the subsea location. The temperature may, for example, change from about 20° C. to about 4° C., which may lead to a significant volume change. Furthermore, in operation, electric or electronic components disposed in the subsea enclosure 111 may generate heat, which may again change the temperature of the liquid and thus its volume. Also, subsea device 110 may be installed in water depths up to or even in excess of 3,000 m, and by the volume compensation system 100, the pressure outside the subsea enclosure 111 is transmitted into the chamber 112. When exposed to the high pressures prevailing at such water depths, the volume of the liquid filling chamber 112 may also experience a change due to the compression of the liquid.

Pressure compensation system 100 includes a first pressure compensator 10, a second pressure compensator 20, and may include further pressure compensators. These pressure compensators may be considered to form a group of pressure compensators. Each pressure compensator includes a movable or deformable element, such as a bellows, membrane, bladder, piston, or the like, which allows a pressure equalization between the pressure in the subsea environment surrounding the subsea device 110 when installed subsea, and which further allows the volume of the liquid filling chamber 112 to change without the build-up of excessive overpressure or negative pressure inside the subsea enclosure 111 (compared to the ambient pressure). The pressure compensators are configured such that movement/deformation of this element results in a change of a compensation volume. Any pressure imbalance between internal and ambient pressure will thus result in a force being applied to the movable or deformable element, which will accordingly move/deform so as to balance the pressures.

Figure 2:
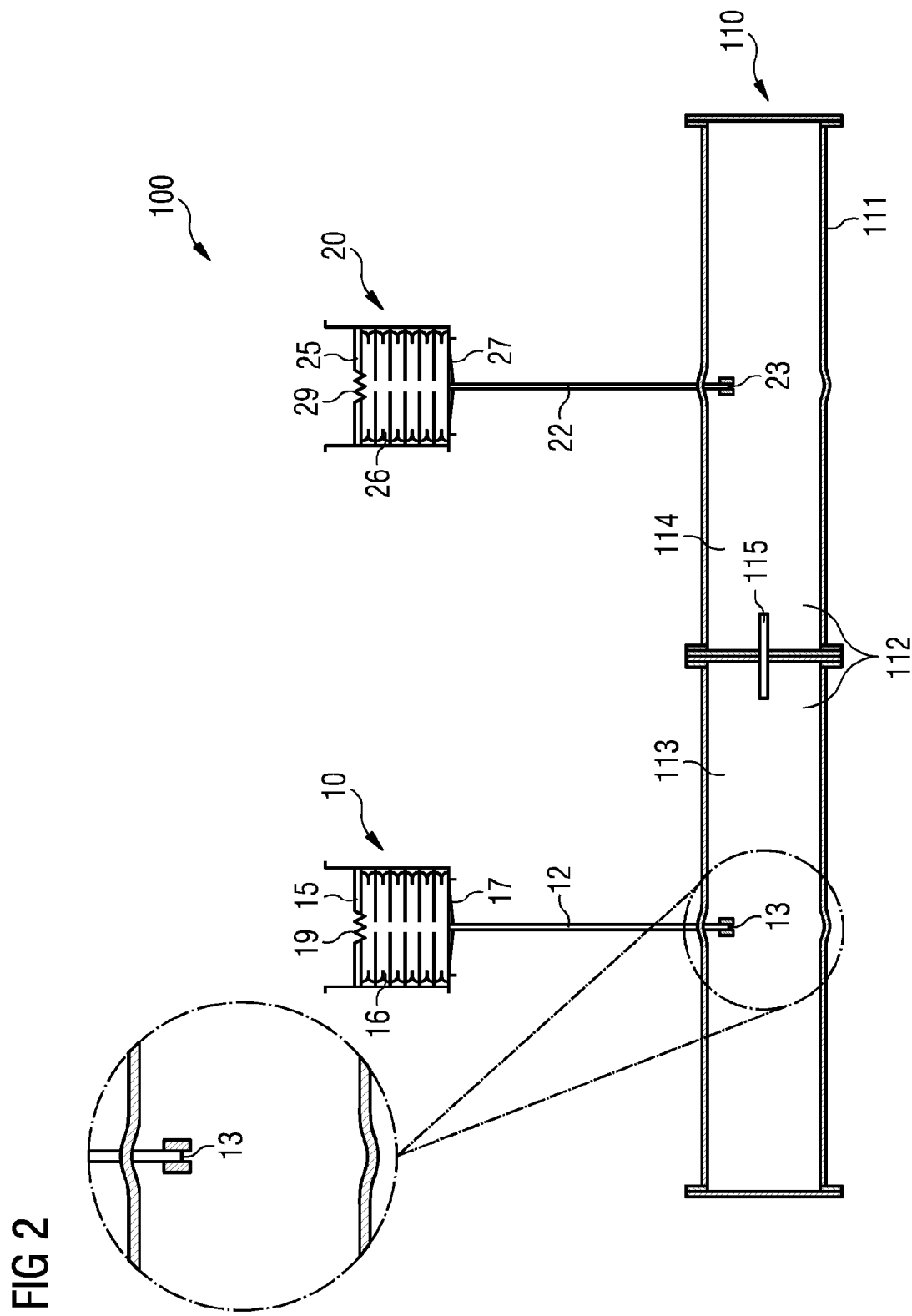
FIG. 2 is a schematic drawing depicting a pressure compensation system according to a further embodiment.

In the example of FIG. 1, each pressure compensator includes a movable first end wall in form of the top plates 15, 25 and a bellows part or portion 16, 26. Since the top plates 15, 25 are movable in the axial direction of the bellows parts, the pressure in the surroundings will be transmitted into the respective compensation volume 11, 21. The compensation volume 11, 21 is again filled with a liquid, (e.g., a dielectric liquid). In the example of FIG. 1, each compensation volume 11, 21 is illustrated with a relatively large dead volume (not available for compensation purposes). This is only for the purpose of a clear and comprehensive presentation to allow a detailed illustration of the flow connections 12, 22, but the dead volume may be minimized in an actual implementation, as illustrated in FIG. 2, for example.

Each compensation volume 11, 21 is connected via a flow connection 12, 22 with the chamber 112. The flow connections 12, 22 may be provided by ducts or pipes, yet they may in other configurations also be provided in form of an opening between the respective compensation volume 11, 21 and the chamber 112.

In each flow connection 12, 22, a controllable valve 13, 23 is provided. The valves 13, 23 may be hydraulically or electrically operated to open and close the respective flow connection 12, 22. When the valve 12, 22 is open, the liquid may thus flow between the respective compensation volume 11, 21 and the chamber 112. Accordingly, the compensation volumes 11, 21 and the chamber 112 may be filled with the same liquid. Although FIG. 1 illustrates valves 13 and 23 to be located outside any further enclosure, the valves may be arranged within the respective compensation volume 11, 21, or may be arranged within the chamber 112. Protection of the valves from the subsea environment may thus be achieved.

Each pressure compensator includes a biasing device 19, 29. The biasing device acts on the respective compensator such that the pressure within the respective compensation volume 11, 21 is slightly increased with respect to the pressure prevailing in the surrounding medium, e.g., with respect to the pressure of the seawater at the subsea installation. The biasing devices 19, 29 apply a force to the movable/deformable element of the respective compensator in a direction such that the pressure inside the respective compensation volume and thus in the chamber 112 is slightly increased. In the example of FIG. 1, each biasing device 19, 29 may include a spring that applies a spring force to, e.g., the end wall or top plate 15, 25 of the respective pressure compensator 10, 20. The overpressure created in the respective compensation volumes 11, 21 is proportional to the applied spring force. Such biasing has the effect that if a leak occurs in the system, for example, in one of the pressure compensators or in the subsea enclosure 111, the liquid filling the respective volume will leak out and thus prevent any seawater from entering the volume.

In such situation, the pressure compensators will compensate for such loss of liquid. If both pressure compensators are in fluid communication, via their respective flow connections 12, 22 and the chamber 112, such leak will lead to a continuous compression of both bellows portions 16, 26. In other words, the top plate 15, 25 of each pressure compensator starts moving down due to the applied spring force and the loss of liquid.

To detect the position and/or movement of the pressure compensators 10, 20, measuring devices 61, 62 are provided at each pressure compensator. The measuring devices 61, 62 may, for example, detect the position of the top plate 15, 25. For this purpose, the measuring devices 61, 62 may include an optical sensor, an inductive sensor or the like. The measuring devices 61, 62 may, for example, be configured as described in the documents EP 2,698,610 A1 or EP 2,698,611 A1, the contents of which are herein incorporated by reference in their entireties.

Subsea pressure compensation system 100 further includes a control unit 51. Control unit 51 may be provided in form of a controller, (e.g., control circuits), it may, for example, include a controller card including a microprocessor. Control unit 51 is configured to control the operation of the valves 13, 23. For electrically operable valves, this may occur via electric control signals, while for hydraulically operated valves, corresponding hydraulic valves are operated by control unit 51 for opening and closing the valves 13, 23.

Pressure compensation system 100 further includes a subsea canister 50 in which the control unit 51 is disposed. In the example of FIG. 1, the subsea canister 50 is separate and adjacent to the subsea enclosure 111. In other embodiments, the subsea canister 50 may be mounted to or may be part of the subsea enclosure 111. The subsea canister 50 may be a pressure resistant canister, so that a predetermined internal pressure is maintained inside the subsea canister 50 even when installed at the subsea location. Accordingly, conventional electric and electronic components may be used inside the subsea canister 50. It may be maintained at an internal pressure smaller than 5 bar, (e.g., at about atmospheric pressure or at about 1.5 bar). In other embodiments, canister 50 may be pressure compensated.

Furthermore, a data acquisition unit 63 is provided in the subsea canister 50. Data acquisition unit 63 is connected to the respective first and second measuring units 61, 62 and acquires data measured by these units. Data acquisition unit 63 may, for example, include a light source required for an optical measurement, it may include analogue to digital converters or the like. Control unit 51 and data acquisition unit 63 may be provided on the same or on different circuit boards. By the data acquisition unit 63, control unit 51 obtains measurements of displacement of the pressure compensators 10, 20, it may, for example, receive information on the position of the respective top plate 15, 25. Control unit 51 is thus configured to receive and to process information on the state of the pressure compensators, in particular, whether they are compressed or extended.

The pressure compensation system 100 may be operated in different modes. In one mode, during normal operation, e.g., when the pressure compensation system 100 is installed subsea and operating to compensate volume variations of the liquid within the chamber 112, one of the valves 13, 23 is open, while the other valve is closed. Accordingly, one pressure compensator is active and compensates the volume variations of the liquid, while the other pressure compensator is in standby and does not contribute to the volume compensation for chamber 112. If the active pressure compensator fails, such as compensator 10, (e.g., due a crack in the bellows portion 16), liquid will leak out. Top plate 15 will thus move downwards to compress the pressure compensator and accommodate for the lost volume of liquid. This compression is detected by measuring unit 61, e.g., by detecting the movement of the top plate 15. The displacement of the top plate 15 is evaluated by the control unit 51. In such situation, control unit 51 detects a drift in the displacement and will determine that the pressure compensator 10, which is active, has failed. Control unit 51 is configured to close the valve 13 and open the valve 23, so that operation may resume with the second compensator 20 now being active while the first and failed pressure compensator 10 is isolated (e.g., flow connection 12 is closed).

Control unit 51 may have further modes of operation. In a further mode of operation, all valves 13, 23 may be opened during normal operation. Control unit 51 may then detect a failure in one of the pressure compensators 10, 20 by detecting a drift in the displacement of both pressure compensators. It may then close one of the valves 13, 23 in order to determine the location of the failed pressure compensator, e.g., to determine which of the two pressure compensators that has failed. It will again measure the displacement of both pressure compensators and analyze the measured displacement for drift. The pressure compensator for which drift is detected will then be isolated by control unit 51 (e.g., by closing the respective valve 13, 23) and operation continues with the remaining and functioning pressure compensator active.

The pressure compensation system 100 may include further pressure compensators to increase the reliability and extend the lifetime of the pressure compensation system. Furthermore, the pressure compensation system 100 may in other embodiments only include fewer measuring units. The pressure compensation system 100 may even be operated with only a single measuring unit for all pressure compensators. As an example, if compensators 10, 20 are not in flow communication and if the displacement of the second pressure compensator, which is measured, does not show any drift, control unit 51 may derive that the failure is at the first pressure compensator.

FIG. 2 depicts a further embodiment of the pressure compensation system 100. Since FIG. 2 is a modification of the system illustrated in FIG. 1, the explanations given above are equally applicable to the embodiment of FIG. 2. In FIG. 2, the measuring units and the control unit are not illustrated for the purpose of a clear presentation, yet they may certainly be present.

In the example of FIG. 2, the chamber 112 includes (or is composed of) two compartments 113, 114, which are in flow communication during normal operation. Furthermore, a valve 115 is provided between the compartments, by which the flow connection between the compartments may be interrupted. The chamber 112 may thus be separated into two fluidically isolated compartments by closing valve 115. The flow connections 12, 22 each lead into a different compartment 113, 114. Accordingly, the flow communication between the pressure compensators 10, 20 may be interrupted by closing the valve 115.

In the embodiment of FIG. 2, the valves 13, 23 are located inside the compartments 113, 114, and thus within the chamber 112. They may thus be protected from the outside environment.

The first and second biasing devices 19, 29 are in the embodiment of FIG. 2 provided in form of the end walls or top plates 15, 25 of the respective pressure compensators 10, 20. By adjusting the weight of the top plates 15, 25, gravitational force will act to compress the respective bellows part 16, 26 and thus create the biasing and the desired overpressure in the medium filling the respective compensation volume. Accordingly, if one of the pressure compensators leaks, the loss of fluid and the gravitational force on the top plates 15, 25 will lead to the top plates moving downwards and compressing the bellows portion 16, 26. Again, such displacement of the pressure compensator may be measured by respective measuring units.

In the example of FIG. 2, each pressure compensator furthermore has a further end wall 17, 27. The flow connection 12, 22 is provided through this second end wall 17, 27. In such configuration, the dead volume of the respective pressure compensator may be kept low. In other embodiments, the second end wall 17, 27 may abut a wall of the subsea enclosure 111, or may form part thereof, as illustrated in FIG. 1.

FIG. 3 depicts a flow diagram of a method according to an embodiment. The method illustrated in FIGS. 3, 4 and 5 may be performed by the pressure compensation system 100 in any of the configurations described herein.

In act S10, the subsea pressure compensation system 100 is operated with the first valve 13 between the first pressure compensator 10 and the chamber 112 open and a second valve 23 between the second pressure compensator 20 and the chamber 112 closed. In act S11, the displacement of the first pressure compensator 10 is measured, e.g., by measuring unit 61. In act S12, the measured displacement is analyzed for a drift, e.g., by control unit 51. If in decision act S13, no drift is detected in the measured displacement, the method continues with act S11, e.g., the active pressure compensator 10 is continuously being monitored.

If, in act S13, drift is detected in the measured displacement, it is in act S14 determined that the first pressure compensator has failed. This determination may be performed by control unit 51. In act S15, control unit 51 closes the first valve 13 and opens the second valve 23. At least one of the valves 13, 23 may be kept open at any time so as to prevent the build-up of excessive negative or overpressure inside the chamber 112. After act S15, the first pressure compensator 10 is isolated from the system, while the second pressure compensator 20 becomes active. Operation of the subsea pressure compensation system is continued in act S16.

In the example illustrated in the flow diagram of FIG. 4, the pressure compensation system 100 is operable initially with both valves 13, 23 open. In act S21, the displacement of the second pressure compensator is measured. Note that this may occur alternatively to the measurement of the displacement of the first pressure compensator, or the displacement of both pressure compensators may be measured. In act S22, the measured displacement is analyzed for a drift, which may again be performed by control unit 51. If in act S23, no drift is detected, the method continues with act S21, e.g., the second pressure compensator is continuously being monitored. If in act S23, a drift is detected, it is determined by control unit 51 in act S24 that one of the pressure compensators has failed. Control unit 51 closes the first valve in act S25, thus closing the flow connection between the first and second pressure compensators. The displacement of the second pressure compensator 20 is measured in act S26, e.g., by measuring unit 62. If no drift is detected in decision act S27, control unit 51 may determine that the first pressure compensator has failed (act S28). Accordingly, since the first valve is already closed and the second valve 23 is opened, operation of the subsea pressure compensation system may continue in act S31, with the first pressure compensator being isolated.

If drift is detected in decision act S27, control unit 51 determines in act S29 that the second pressure compensator has failed. It further opens the first valve 13 and closes the second valve 23 in act S30. Operation is then continued in act S31, with the second pressure compensator 20 now being isolated, and first pressure compensator 10 being active.

As may be seen, a fast an efficient method of detecting the location of the failed pressure compensator is provided, and even if such failure occurs, operation may continue.

FIG. 5 is a flow diagram that illustrates a method that may be performed by a pressure compensation system that has two or more pressure compensators, e.g., three, four, five or more pressure compensators. In act S40, the pressure compensation system 100 is operated with the fluid connection, in particular, the valves, between the two or more pressure compensators and the chamber 112 open. As an example, all available pressure compensators may be active and thus in flow communication with chamber 112. The displacement of at least one pressure compensator is measured in act S41. This is sufficient since if one compensator fails, all compensators will show drift. In act S42, the measured displacement is analyzed for drift. If no drift is detected in decision act S43, measuring the displacement and thus monitoring of the at least one pressure compensator is continued in act S41.

If drift is detected in act S43, it is determined that a pressure compensator has failed. In act S44, one pressure compensator is isolated from the remaining pressure compensators, e.g., by closing the valve in the flow connection of the respective pressure compensator. In the illustrated method, it is assumed that each pressure compensator is provided with a measuring unit 61, 62. In act S45, the displacement of the isolated compensator is measured and analyzed for a drift (act S46). If no drift is detected (decision act S47), a different pressure compensator of the remaining pressure compensators is isolated in act S48, and the method continues with act S45, thus measuring the displacement of the now isolated pressure compensator. This way, all pressure compensators are checked until the pressure compensator that is responsible for the drift is identified.

If drift is detected in decision act S47, it is determined in act S49 that the now isolated pressure compensator has failed. If this is not already the case, then the valve of the failed pressure compensator is closed in act S50. Operation of the subsea pressure compensation system 100 may then continue in act S51 with the valves to the remaining pressure compensators being open. Even in a system including multiple pressure compensators, the method thus allows a fast and efficient detection of the location of a failed pressure compensator and the isolation thereof.

In a pressure compensation system having only one displacement sensor, the method may, for example, be modified by first checking the displacement of the pressure compensator equipment with the measuring unit, and if this pressure compensator is functional, connecting a fluid connection between these pressure compensators and the other pressure compensators, one after the other, so that the pressure compensator that is responsible for the drift may be identified. In another embodiment, one pressure compensator after the other may be disconnected from chamber 112, and the location of the failed compensators may be determined by detecting in which configuration the displacement stops showing drift. The then isolated compensator will be the one that has failed.

Note that the detection schemes described with respect to FIGS. 3-5 may be modified and combined with each other. Furthermore, the pressure compensation system 100 may be configured to perform any of the described methods.

While specific embodiments are disclosed herein, various changes and modifications may be made without departing from the scope of the invention. The present embodiments are to be considered in all respects as illustrative and non-restrictive, and all changes coming within the meaning and equivalency range of the appended claims are intended to be embraced therein.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A pressure compensation system for compensating volume variations of a liquid in a chamber of a subsea device, the pressure compensation system comprising:
   a subsea enclosure of the subsea device enclosing the chamber;
   a first pressure compensator comprising a first compensation volume and configured to provide a first pressure balancing between ambient medium surrounding the subsea device and the first compensation volume, wherein a flow connection is provided between the first compensation volume and the chamber;

a first biasing device configured to bias the first pressure compensator such that a pressure in the first compensation volume is higher than a pressure in the ambient medium surrounding the subsea device;

a second pressure compensator comprising a second compensation volume and configured to provide a second pressure balancing between ambient medium surrounding the subsea device and the second compensation volume, wherein a flow connection is provided between the second compensation volume and the chamber;

a second biasing device configured to bias the second pressure compensator such that a pressure in the second compensation volume is higher than a pressure in the ambient medium surrounding the subsea device;

a controllable first valve arranged in the flow connection between the first compensation volume and the chamber, the first valve configured to stop fluid flow between the first compensation volume and the chamber;

a controllable second valve arranged in the flow connection between the second compensation volume and the chamber, the second valve configured to stop fluid flow between the second compensation volume and the chamber; and a control unit connected to the first valve and the second valve, wherein the control unit is configured to have a mode of operation in which the first valve is open and the second valve is closed so as to provide pressure compensation of the chamber by the first pressure compensator and to maintain the second pressure compensator in standby, and wherein the control unit is configured to automatically shut the first valve and automatically open the second valve upon detecting a failure of the first pressure compensator.

2. The pressure compensation system according to claim 1, wherein the control unit is further configured to have a mode of operation in which the first valve and the second valve are open so as to provide pressure compensation of the chamber simultaneously by the first pressure compensator and the second pressure compensator.

3. The pressure compensation system according to claim 1, wherein the first pressure compensator, the second pressure compensator, or each of the first pressure compensator and the second pressure compensator is a bellows type pressure compensator.

4. The pressure compensation system according to claim 1, wherein the first compensation volume, the second compensation volume, or each of the first compensation volume and the second compensation has first and second end walls and a bellows part disposed between the first and second end walls, wherein the first end wall is a movable end wall in an axial direction of the bellows part.

5. The pressure compensation system according to claim 1, further comprising:
a subsea canister disposed adjacent to the subsea enclosure of the subsea device, wherein the control unit is arranged in the subsea canister.

6. The pressure compensation system according to claim 1, wherein the first pressure compensator and the second pressure compensator are individually sized so that the first pressure compensator or the second pressure compensator alone is capable of compensating the volume variations of the liquid in the chamber.

7. The pressure compensation system according to claim 1, further comprising:
one or more further pressure compensators, biasing devices, and controllable valves.

8. The pressure compensation system according to claim 1, further comprising:
a first measuring unit, a second measuring unit, or the first measuring unit and the second measuring unit,
wherein the first measuring unit is configured to measure a displacement of the first pressure compensator,
wherein the second measuring unit is configured to measure a displacement of the second pressure compensator,
wherein the control unit is configured to determine a presence of the failure of the first pressure compensator or a failure of the second pressure compensator based on the displacement of the first pressure compensator or the displacement of the second pressure compensator, respectively.

9. The pressure compensation system according to claim 8, further comprising:
a subsea canister disposed adjacent to the subsea enclosure of the subsea device, wherein the control unit is arranged in the subsea canister.

10. The pressure compensation system according to claim 9, further comprising:
one or more further pressure compensators, biasing devices, and controllable valves.

11. The pressure compensation system according to claim 1, wherein the control unit is configured to determine a location of the failure at the first pressure compensator by detecting a drift in a displacement of the first pressure compensator when the first compensation volume and the second compensation volume are not in fluid communication.

12. The pressure compensation system according to claim 11, wherein the control unit detects the drift in the displacement of the first pressure compensator based on a displacement of a movable end wall of the first pressure compensator.

13. The pressure compensation system according to claim 1, wherein the first pressure compensator and the second pressure compensator are single barrier pressure compensators that comprise a single bellows wall separating the respective compensation volume from ambient medium.

14. The pressure compensation system according to claim 13, wherein the ambient medium is surrounding sea water when installed subsea.

15. A subsea device comprising:
a pressure compensation system comprising:
a subsea enclosure of the subsea device enclosing a chamber;
a first pressure compensator comprising a first compensation volume and configured to provide a first pressure balancing between ambient medium surrounding the subsea device and the first compensation volume, wherein a flow connection is provided between the first compensation volume and the chamber;
a first biasing device configured to bias the first pressure compensator such that a pressure in the first compensation volume is higher than a pressure in the ambient medium surrounding the subsea device;

a second pressure compensator comprising a second compensation volume and configured to provide a second pressure balancing between ambient medium surrounding the subsea device and the second compensation volume, wherein a flow connection is provided between the second compensation volume and the chamber;

a second biasing device configured to bias the second pressure compensator such that a pressure in the second compensation volume is higher than a pressure in the ambient medium surrounding the subsea device;

a controllable first valve arranged in the flow connection between the first compensation volume and the chamber, the first valve configured to stop fluid flow between the first compensation volume and the chamber;

a controllable second valve arranged in the flow connection between the second compensation volume and the chamber, the second valve configured to stop fluid flow between the second compensation volume and the chamber; and a control unit connected to the first valve and the second valve, wherein the control unit is configured to have a mode of operation in which the first valve is open and the second valve is closed so as to provide pressure compensation of the chamber by the first pressure compensator and to maintain the second pressure compensator in standby, and wherein the control unit is configured to automatically shut the first valve and automatically open the second valve upon detecting a failure of the first pressure compensator, wherein the subsea device is a subsea transformer, subsea switchgear, or subsea variable speed drive.

16. A method of operating a pressure compensation system, wherein the pressure compensation system comprises (1) a subsea enclosure of a subsea device enclosing a chamber, (2) a first pressure compensator comprising a first compensation volume, wherein a flow connection is provided between the first compensation volume and the chamber, (3) a first biasing device, (4) a second pressure compensator comprising a second compensation volume, wherein a flow connection is provided between the second compensation volume and the chamber, (5) a second biasing device, (6) a controllable first valve arranged in the flow connection between the first compensation volume and the chamber, (7) a controllable second valve arranged in the flow connection between the second compensation volume and the chamber, and (8) a control unit connected to the first valve and the second valve, the method comprising:

operating the pressure compensation system in a normal mode of operation with the first valve in an open position and the second valve in a closed position such that the second pressure compensator is in standby;

detecting a failure of the first pressure compensator; and automatically closing the first valve and opening the second valve upon the detection of the failure of the first pressure compensator.

17. The method according to claim 16, wherein the detecting of the failure of the first pressure compensator comprises:

measuring a displacement of the first pressure compensator;

determining a location of the failed pressure compensator by determining whether the first pressure compensator has failed based on a detection of drift in the measured displacement.

* * * * *